United States Patent
Li et al.

(10) Patent No.: US 8,854,149 B2
(45) Date of Patent: Oct. 7, 2014

(54) MEMS RESONATOR, MANUFACTURING METHOD THEREOF, AND SIGNAL PROCESSING METHOD USING MEMS RESONATOR

(75) Inventors: Sheng-Shian Li, Taoyuan County (TW); Cheng-Syun Li, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 62 days.

(21) Appl. No.: 13/615,656

(22) Filed: Sep. 14, 2012

(65) Prior Publication Data

US 2014/0002201 A1 Jan. 2, 2014

(30) Foreign Application Priority Data

Jun. 28, 2012 (TW) .............................. 101123297 A (51) Int. Cl.
H03B 5/30 (2006.01)
H03H 9/05 (2006.01)
H03H 9/24 (2006.01)

(52) U.S. Cl.
USPC ......................................... 331/154; 333/186

(58) Field of Classification Search
USPC ......... 310/311, 314, 321, 329, 330, 333, 367, 310/368, 370; 331/116 FE, 116 M, 116 R, 331/154–156, 158; 333/186, 200, 219, 333/219.1
See application file for complete search history.

(56) References Cited

U.S. PATENT DOCUMENTS

| | | | | |
|---|---|---|---|---|
| 3,609,593 A | * | 9/1971 | Boll et al. | 331/156 |
| 5,090,254 A | * | 2/1992 | Guckel et al. | 73/862.59 |
| 7,205,867 B2 | * | 4/2007 | Lutz et al. | 333/186 |
| 7,295,088 B2 | | 11/2007 | Nguyen et al. | |
| 7,382,205 B2 | * | 6/2008 | Van Beek | 331/154 |
| 7,551,043 B2 | | 6/2009 | Nguyen et al. | |
| 7,750,745 B2 | * | 7/2010 | Van Beek | 331/116 M |
| 7,750,759 B1 | | 7/2010 | Lee et al. | |
| 7,777,596 B2 | * | 8/2010 | Lutz et al. | 333/186 |
| 7,819,011 B2 | * | 10/2010 | Hao et al. | 73/649 |
| 7,898,148 B2 | * | 3/2011 | Steeneken et al. | 310/317 |
| 7,898,158 B1 | | 3/2011 | Li et al. | |
| 8,159,307 B2 | * | 4/2012 | Yamaguchi et al. | 331/116 M |
| 8,269,578 B2 | * | 9/2012 | Phan Le et al. | 333/186 |
| 8,367,305 B1 | * | 2/2013 | Wojciechowski et al. | 430/319 |
| 8,461,936 B2 | * | 6/2013 | Vermeeren et al. | 331/154 |
| 8,593,032 B2 | * | 11/2013 | Phan Le et al. | 310/318 |
| 2012/0032747 A1 | | 2/2012 | Vermeeren et al. | |

OTHER PUBLICATIONS

Li et al., "Capacitively-Driven and Piezoresistively-Sensed CMOS-MEMS Resonators", Microelectromechanical Systems, 2012 IEEE 25th International Conference, pp. 539-542, Feb. 12, 2012.*

(Continued)

Primary Examiner — Levi Gannon
(74) Attorney, Agent, or Firm — CKC & Partners Co., Ltd.

(57) ABSTRACT

A capacitively-driven Micro-Electro-Mechanical System (MEMS) resonator is provided, in which a piezoresistively differential measurement is used to enable the MEMS resonator to transfer a signal. The MEMS resonator uses a Complementary Metal-Oxide-Semiconductor (CMOS) manufacturing process to make its oscillator and piezoresistor to achieve electrical insulation, thereby lowering the level of feedthrough signal.

21 Claims, 9 Drawing Sheets

(56) References Cited

OTHER PUBLICATIONS

Cheng-Syun Li et al., Capacitively-Driven and Piezoresistively-Sensed CMOS-MEMS resonators, Micro Electro Mechanical Systems (MEMS), 2012 IEEE 25th International Conference, pp. 539-542, Jan. 29, 2012-Feb. 2, 2012.

Cheng-Syun Li et al., Differential Measurement of Piezoresistive Transduction for Silicon-Based MEMS Resonators, 2012 IEEE Int. Frequency Control Symp. (IFCS'12), pp. 1-4, May 21, 2012-May 24, 2012.

* cited by examiner

MEMS RESONATOR, MANUFACTURING METHOD THEREOF, AND SIGNAL PROCESSING METHOD USING MEMS RESONATOR

RELATED APPLICATIONS

The application claims priority to Taiwan Application Serial Number 101123297, filed Jun. 28, 2012, which is herein incorporated by reference.

BACKGROUND

1. Field of Invention

The present invention relates to a resonator, a manufacturing method of the resonator, and a signal processing method using the resonator. More particularly, the present invention relates to an MEMS (Micro-Electro Mechanical System) resonator, a manufacturing method of the MEMS resonator, and a signal processing method using the MEMS resonator in the field of wireless communication and sensor applications.

2. Description of Related Art

A Micro-Electro Mechanical System, or MEMS, is formed by an industrial technology using micro- or nano-matching techniques combined with micro-electronics. The MEMS is more miniaturized, and has the properties of relatively high accuracy, low cost and can be mass-produced as compared with a conventional electro mechanical system. The MEMS can be applied to various fields, such as biology, medicine, chemistry, optics, thermal physics, electronics, semiconductors technologies, etc. Thus, the conventional electro mechanical system has been gradually replaced by the MEMS. Applications and performance of the MEMS depend on its manufacturing material, manufacturing approach, and structure.

As compared with a conventional transistor circuit, a MEMS electric component such as a resonator, an oscillator, a clock generator, a filter, and a mixer has a relatively high-quality factor, low power loss, high feasibility in the field of wireless communication and sensor applications, and can be combined with existing IC manufacturing skills. Therefore, the MEMS technique has a much higher quality-price ratio than a conventional mechanical manufacturing skill. Besides, the integration of the MEMS technique can be more diversified through programmable functions, and thus the MEMS technique is vigorously grown in a wireless communication field, especially in an RF (Radio Frequency) field.

In the past, in order to obtain high-quality factor performance, passive components cannot be shrunk and integrated with transistor circuits. Furthermore, the bulky size and exotic nature of the entire RF system demands a discrete feature, and the discrete feature further impedes system miniaturization, integration, and thus impedes cost reduction of future portable electronics.

Generally, resonators can be classified into four types according their transduction mechanisms, which are piezoelectric, electrostatic, electromagnetic, and magnetostrictive types. U.S. Pat. No. 7,023,065 discloses an electrostatic MEMS resonator (i.e. a capacitive resonator) and a manufacturing method thereof. The capacitive resonator is configured as a in-plane clamped-clamped beam resonator formed from single crystal silicon. An electronic signal is applied to a driving electrode to induce an electrostatic field on the in-plane clamped-clamped beam resonator, and the electrostatic field enables the oscillator to create an oscillation signal. When the frequency of the oscillation signal is equal or close to that of the electronic signal, a change of the gap between the drive electrode and the clamped-clamped beam is generated. The oscillation signal can further be measured by a sensing electrode which senses an electronic signal converted from the change.

A piezoresistive MEMS resonator and a manufacturing method thereof have been disclosed in CN Patent Application No. 201010604008. The piezoresistive MEMS resonator includes an anchor, a resonator arranged on the anchor, an electrostatic force which has been created from an actuator applied to the resonator, and a device for reading out piezoresistive values comprises a nanowire coupled to the resonator, wherein the resonator includes an area of at least $100\,\mu m^2$, and the nanowire includes a cross-section area of at most $10^{-14}$ $m^2$. A giant piezoresistive effect is shown while a low power miniature piezoresistive readout scheme is combined with a bulk resonator. Since the giant piezoresistive effect created in a silicon nanowire is much larger than the piezoresistive effect created in a bulk resonator, the signaling speed thereof can be enhanced U.S. Pat. No. 7,750,759 discloses a multi-mode MEMS resonator system including electrostatic resonators and piezoelectric resonators. Different materials are chosen to be used with the identical structure to achieve a purpose of substituting the electrostatic type with the piezoresistive type or the piezoresistive type with the electrostatic type while in use.

SUMMARY

Hence, an aspect of the present invention is to provide a MEMS resonator for providing a high quality factor and a high signal-to-feedthrough ratio, thus lowering cost and reducing the operation area occupied by passive components.

According to an embodiment of the present invention, an MEMS resonator is provided. The MEMS resonator comprises a substrate, an oscillator, a piezoresistor and an oscillation initiator, wherein the oscillator is located on the substrate. The piezoresistor is arranged in the oscillator or its supporting structures. The piezoresistor comprises a first output end for outputting a first output signal and a second output end for outputting a second output signal. A phase of the second output signal is different from a phase of the first output signal, and an oscillation initiator is arranged on the substrate.

The invention further provides a signal processing method using the MEMS resonator. Oscillation of an oscillator is initiated by an oscillation initiator. Afterwards, a piezoresistor is oscillated by the oscillator. A first output signal and a second output signal may then be outputted from the first output end and the second output end of the piezoresistor, respectively.

The invention further provides a manufacturing method of the MEMS resonator. The piezoresistor, the second electrode and the first electrode are covered in the substrate sequentially, and then the oscillator is suspended after the substrate is etched. In addition, the piezoresistor and the second electrode are covered by the oscillator. The piezoresistor is extended out or contracted in of the oscillator to form the first output end and the second output end. Besides, there is a phase difference between the second output signal which is outputted from the second output end and the first output signal which is outputted from the first output end.

The invention further provides another manufacturing method of the MEMS resonator. The piezoresistor, the second electrode, and the first electrode are covered in the substrate sequentially, and then the oscillator is suspended after the substrate is etched. In addition, the piezoresistor is covered by the oscillator. The piezoresistor is extended out of the oscillator to form a first output end and a second output end. Besides, there is a phase difference between the second output signal which is outputted from the second output end and the first output signal which is outputted from the first output end.

Hence, the aforementioned embodiments regarding the MEMS resonator may obtain a higher motional signal compared with conventional resonators using single capacitors or single piezoresistors, wherein the motional signal is blocked by the strong feed-through signal.

Plus, signals with relatively single frequency and low noise can be obtained after comparing and operating the phase difference between the first output signal and the second output signal acquired from the two output ends of the piezoresistor. Thus, the MEMS resonator can be more miniaturized in structure compared with those using conventional mechanical manufacturing techniques. In short, the present invention is not only space-saving but also material-saving, and therefore a high added value is provided.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
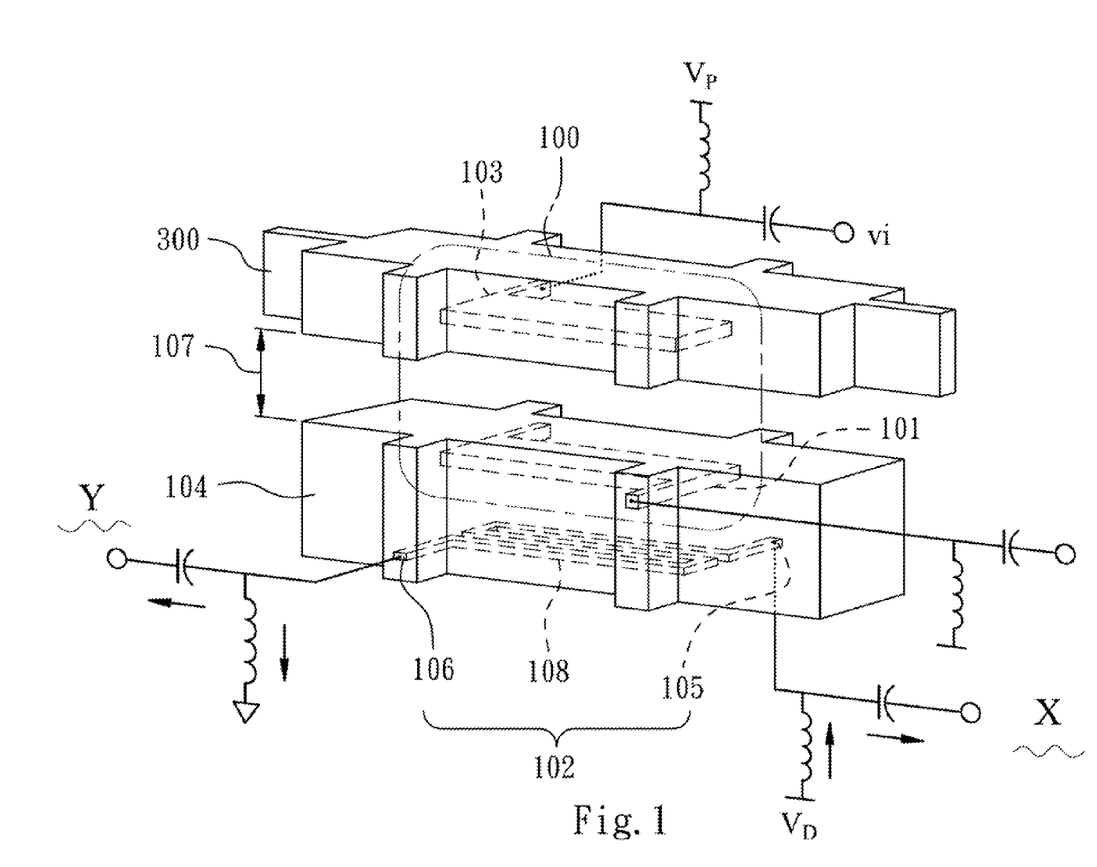
FIG. 1 is a perspective view of a MEMS resonator in accordance with an embodiment of the present invention.
Figure 2:
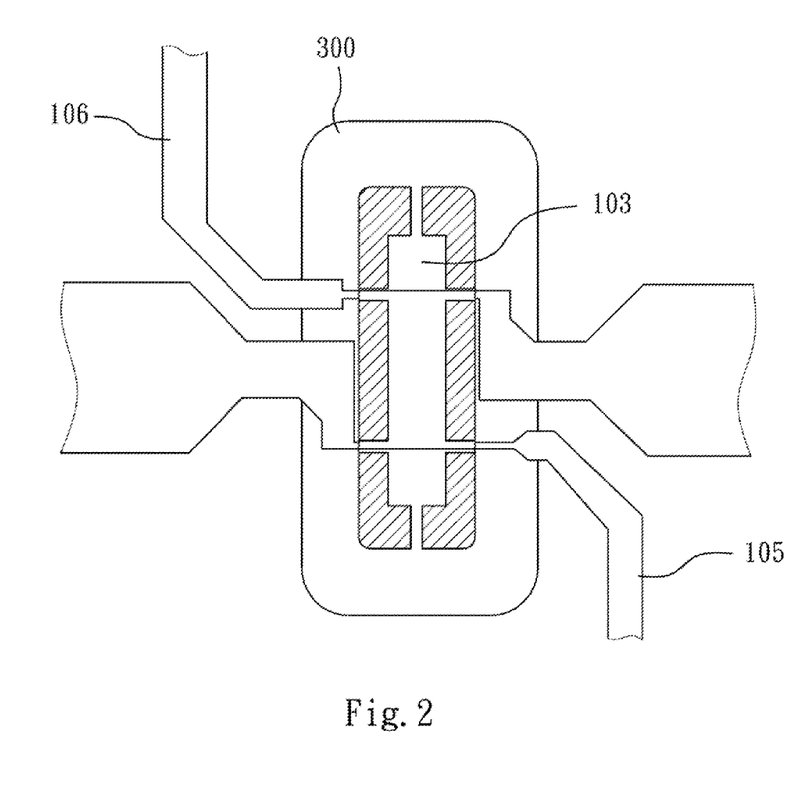
FIG. 2 is a top view of a MEMS resonator in accordance with an embodiment of the present invention.
Figure 3:
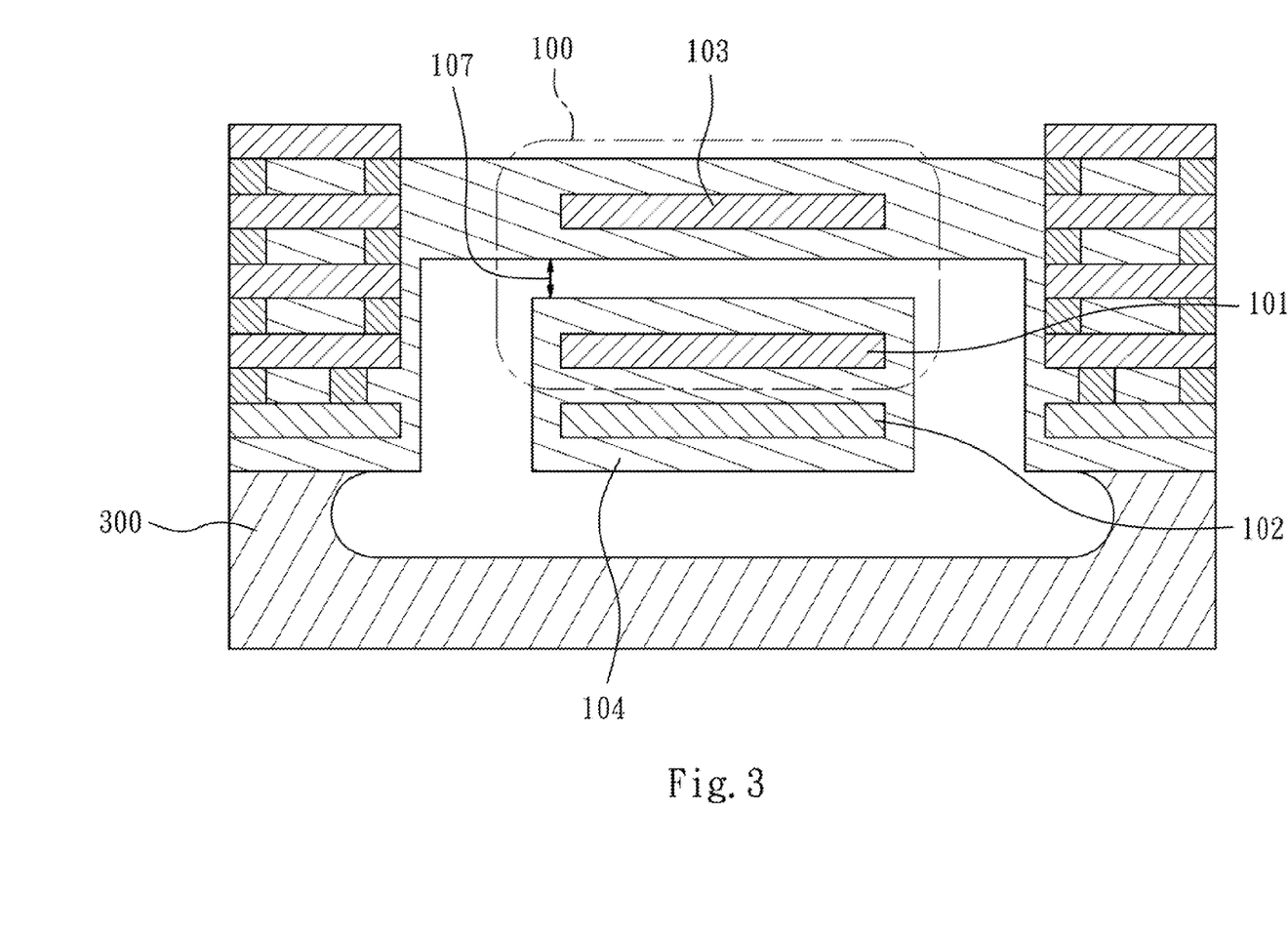
FIG. 3 is a cross-sectional view of a MEMS resonator in accordance with an embodiment of the present invention.

Please refer to FIG. 1, FIG. 2 and FIG. 3. FIG. 1, FIG. 2 and FIG. 3 are a perspective view, a top view, and a cross-sectional view of a MEMS resonator, respectively. An oscillation initiator herein is a capacitor. The MEMS resonator comprises a substrate 300, an oscillator 104, a piezoresistor 102 and a capacitor 100, wherein the oscillator 104 is located on the substrate 300. The piezoresistor 102 is arranged in the oscillator 104. The piezoresistor 102 comprises a first output end 105 for outputting a first output signal X, and a second output end 106 for outputting a second output signal Y. A phase of the second output signal Y is different from a phase of the first output signal X, such a phase difference is ranged from 150 degrees to 210 degrees, whereas the phase difference in this embodiment is 180 degrees. The capacitor 100 includes a first electrode 103 and a second electrode 101, wherein the first electrode 103 is located on the substrate 300, and the second electrode 101 is located on the oscillator 104. In addition, there is a gap 107 formed between the first electrode 103 and the second electrode 101, wherein the first electrode 103 and the second electrode 101 are arranged in corresponding positions. Moreover, $V_D$ represents a first DC voltage source, $V_p$ represents a second DC voltage source, and v represents an AC voltage source. Besides, the MEMS resonator can be fabricated by using conventional CMOS fabrication processes, such as acidic etching, reactive ion etching, and Si isotropic etching of $XeF_2$.

In the aforementioned MEMS resonator, the substrate 300 can be a silicon bulk. The material forming the first electrode 103 and the second electrode 101 of the capacitor 100 can be a metal, such as gold, copper, silver, platinum, nickel, tungsten, aluminum, etc. The material forming the piezoresistor 102 can be a polysilicon material, a mono-silicon material, an amorphous silicon material, a silicon-germanium material or a silicon-carbide material. The oscillator 104 can be formed from a dielectric material such as silicon oxide.

Figure 4A:
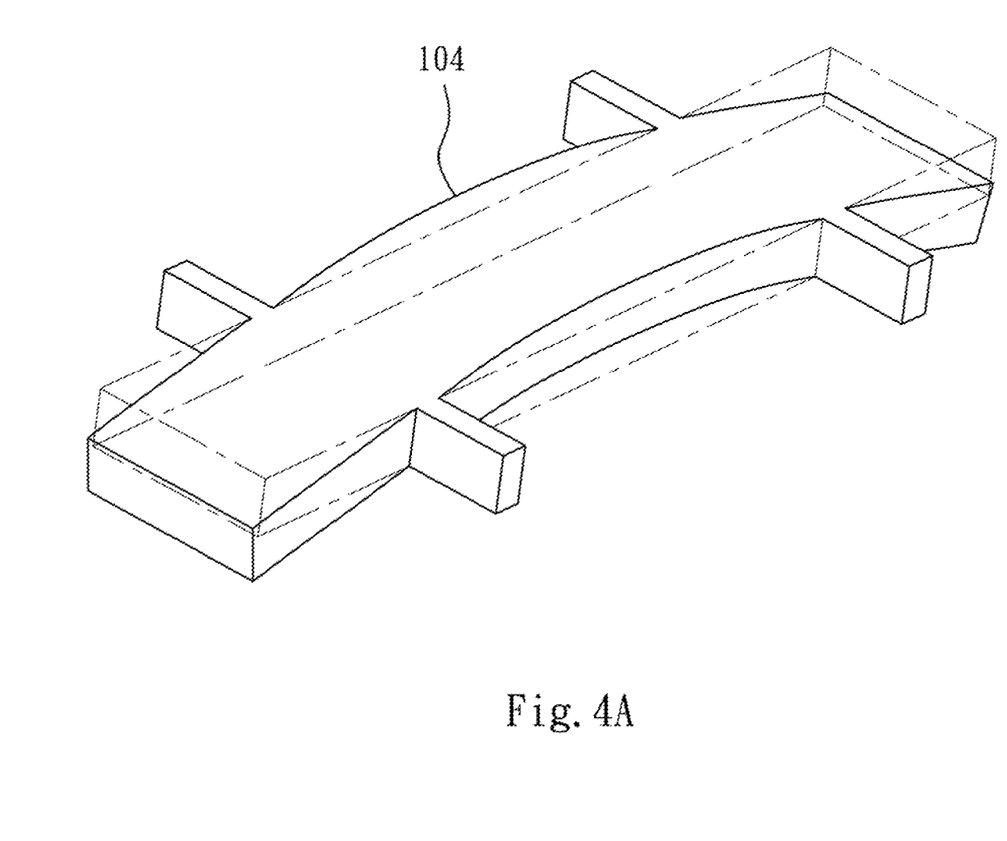
FIG. 4A is a schematic view showing the oscillation of the MEMS resonator in accordance with an embodiment of the present invention.
Figure 4B:
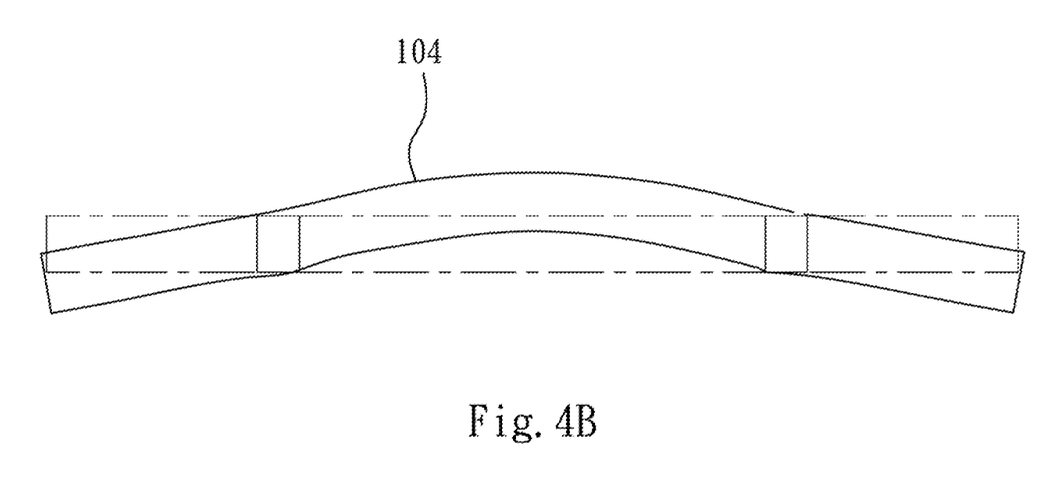
FIG. 4B is a lateral view of the MEMS resonator in accordance with an embodiment of the present invention.

The oscillator 104 described above can be beam shaped and comprises two free ends, and the oscillator undergoes a flexural-type oscillation (FIG. 4A and FIG. 4B). However, the piezoresistor 102 and the second electrode 101 are covered by the oscillator 104, and thus are not shown in the figures. What is more, the piezoresistor 102 and the second electrode 101 are separated by the oscillator 104. The structure between the first output end 105 and the second output end 106 is clip-shaped, namely the clip-shaped structure 108.

Please refer to FIG. 4A and FIG. 4B. FIG. 4A and FIG. 4B are a schematic view showing the oscillation of the MEMS resonator and a lateral view of the MEMS resonator, respectively. The oscillator 104 of the MEMS resonator is in a beam shape, and is oscillated in a flexural-type. In comparison with the prior art, in which the oscillator is fixed by an anchor, the anchor of the oscillator 104 of the present invention is designed to be located at a node which has the minimum displacement during the oscillation of the oscillator 104, thus reducing the internal loss of signals.

Figure 5:
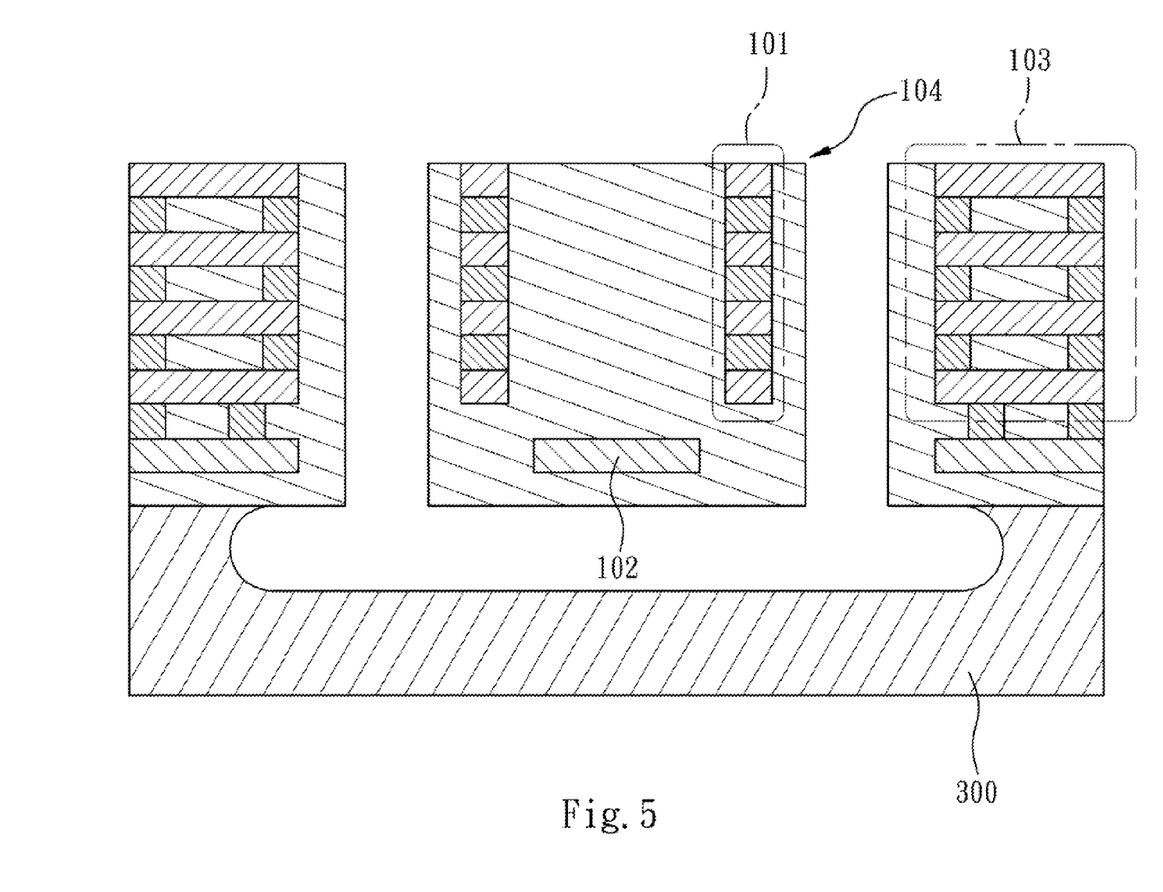
FIG. 5 is a cross-sectional view of the MEMS resonator in accordance with another embodiment of the present invention.
Figure 6:
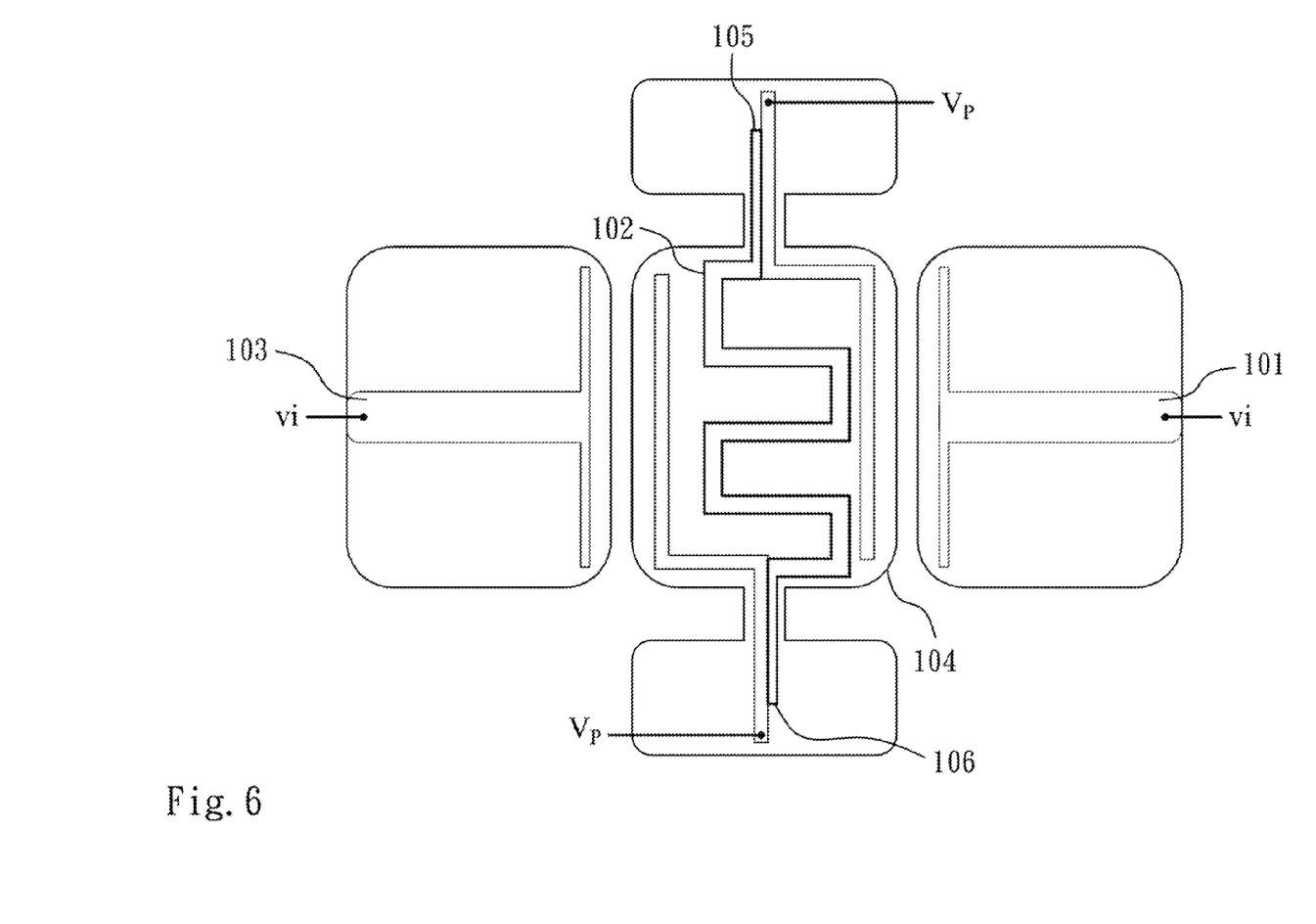
FIG. 6 is a schematic view of the MEMS resonator n accordance with another embodiment of the present invention.

Please refer to FIG. 5 and FIG. 6 for presenting another embodiment. FIG. 5 and FIG. 6 are a cross-sectional view and a schematic view of the MEMS resonator, respectively. The MEMS resonator comprises a substrate 300 an oscillator 104, a piezoresistor 102, a first electrode 103, and a second electrode 101. The oscillator 104 is arranged on the substrate 300 and the piezoresistor 102 is arranged in the oscillator 104. The piezoresistor 102 comprises a first output end 105 and a second output end 106, in which phases of output signals outputted from the output ends are different. Such a phase difference of the output signals can be ranged from 150 degrees to 210 degrees, whereas the phase difference in this embodiment is 180 degrees. The first electrode 103 and the second electrode 101 are arranged at the both sides of the capacitor 100 in corresponding positions. The structure between the first output end 105 and the second output end 106 is clip-shaped, namely the clip-shaped structure 108. According to the above description, the first electrode 103, the second electrode 101 and the oscillator 104 form a capacitor, and thus the oscillator 104 generates an oscillation.

Figure 7:
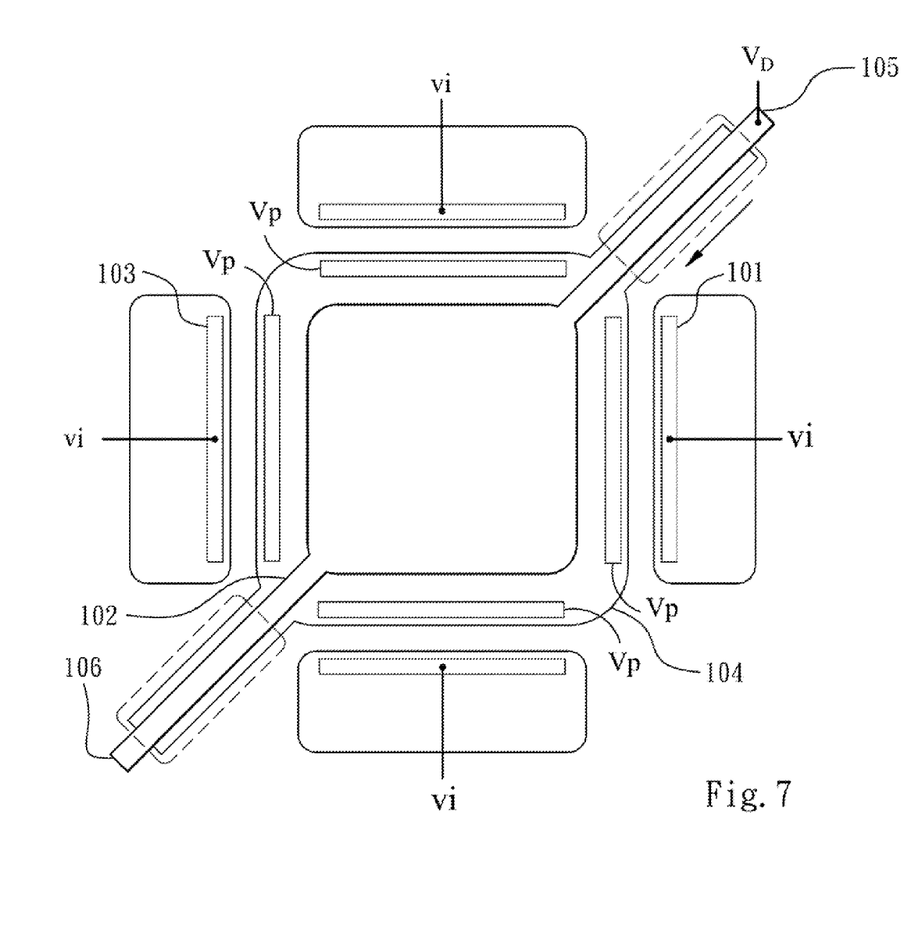
FIG. 7 is a schematic view of a MEMS resonator in accordance with still another embodiment of the present invention.

Please refer to FIG. 7. FIG. 7 illustrates still another embodiment of the MEMS resonator. The components of the MEMS resonator in this embodiment are the same as the components in the embodiments described above. The main difference between the components of the MEMS resonator and those of the aforementioned embodiments is that the piezoresistor 102 of this embodiment may undergo either a thickness shear mode oscillation or a stretching oscillation.

Figure 8:
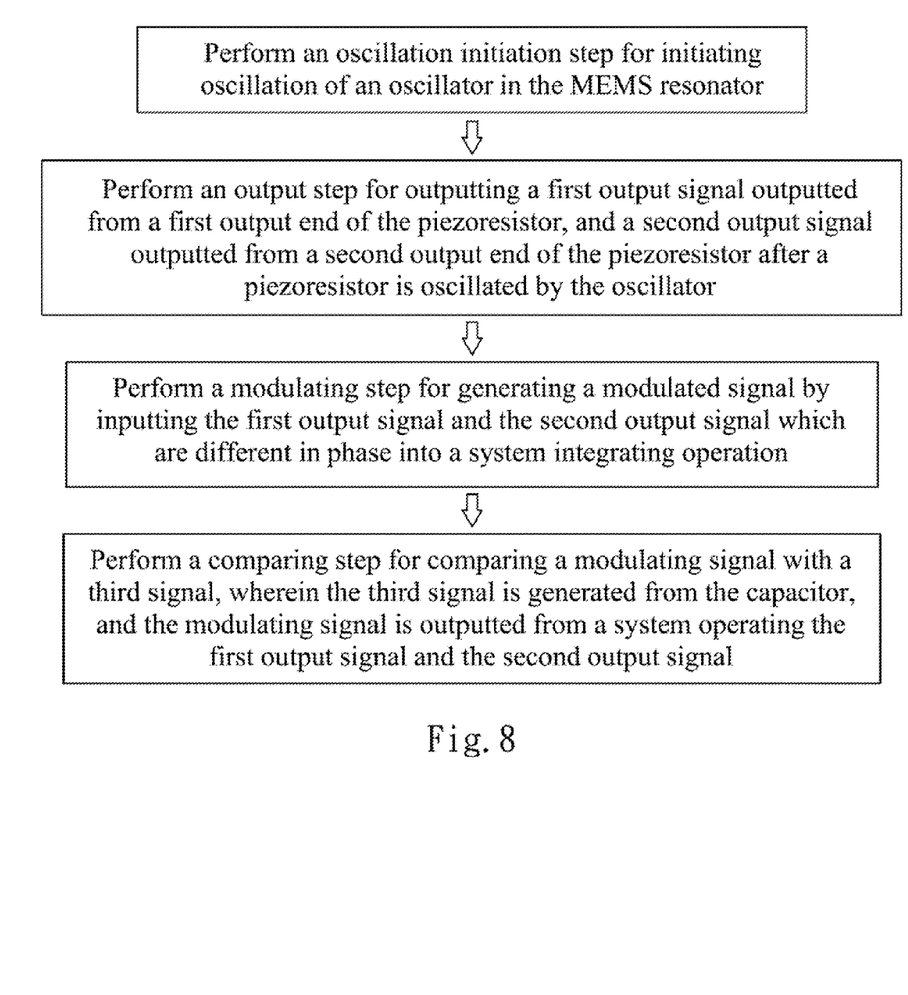
FIG. 8 is a flow chart of a signal processing method using the MEMS resonator of the present invention.

Please refer to the FIG. 8. FIG. 8 illustrates a signal processing method using the MEMS resonator illustrated from FIG. 1 to FIG. 7. The signal processing method using the MEMS resonator comprises performing an oscillation initiation step, an output step, and a modulation step and a comparing step.

In the oscillation initiation step, an electrostatic force is generated by the capacitor 100 by inputting an electric signal into the MEMS resonator, thereby leading to an oscillation of the oscillator 104 in the MEMS resonator.

In the outputting step, oscillation of a piezoresistor 102 is generated after the oscillation initiation of the oscillator 104. The first output signal X and the second output signal Y with different phases are respectively outputted from the first output end 105 and the second output end 106 of the piezoresistor 102 with an additional direct-current signal which is modulated through the oscillation of the piezoresistor 102. In addition, the phase difference between the first output signal and the second output signal is varied from 150 degrees to 210 degrees. The modulating step is to input the first output signal X and the second output signal Y with a phase difference into an external system, in which the system comprises a set of software and hardware or a set of firmware and hardware. A modulating signal can be outputted from the external system by operating and integrating the first output signal X and the second output signal Y.

The aforementioned comparing step is to input the modulating signal and a third signal generated from the capacitor 100 into another system for a further operation, thus obtaining an optimized signal by the operation of the system.

In another embodiment of the present invention provides a manufacturing method of the MEMS resonator according to FIG. 1, and the manufacturing method comprises the following steps. By using the conventional standard CMOS processing methods, the piezoresistor 102 is first deposited followed by the deposition of two metal electrodes, namely the first electrode 103 and the second electrode 101, such that the piezoresistor 102, the second electrode 101 and the first electrode 103 are covered by the substrate 300 sequentially. Then, a $XeF_2$ isotropic etching method is applied for etching the substrate 300 to suspend the oscillator 104. Then, the piezoresistor 102 and the second electrode 101 is separated by a silicon dioxide layer, and the whole piezoresistor 102 and the second electrode 101 are covered by the silicon dioxide layer, such that the piezoresistor 102 and the second electrode 101 is covered by the oscillator 104 as well. Next, the piezoresistor 102 is extended out or contracted in of the oscillator to form a first output end 105 and a second output end 106, and the phase of the second output signal Y outputted from the second output end 106 is different from the phase of the first output signal X outputted from the first output end 105.

The MEMS resonator of the present invention utilizes a capacitor 100 and a piezoresistor to induce the oscillator 104. A second electrode 101 and the piezoresistor 102 are inserted into the oscillator 104 by using the conventional CMOS manufacturing process. Therefore, the capacitor 100 and the piezoresistor 102 are not coupled together for achieving an insulating effect. An alternating-current voltage has been applied to the resonator and further leads the capacitor 100 to induce the oscillation of the oscillator 104. Meanwhile, a direct-current voltage or direct-current current source is applied to the piezoresistor 102 of the oscillator 104 to generate signals varying with the oscillation. From the above, the first output signal X and the second output signal Y can be further obtained from the first output end 105 and the second output end 106 of the piezoresistor 102, respectively.

According to one or more embodiments, a manufacturing method of the MEMS resonator is provided. The manufacturing method used for manufacturing the EMS resonator according to FIG. 5. The method comprises the following steps. First, the piezoresistor 101, the second electrode 101 and the first electrode 103 are covered by the substrate 300 sequentially. Next, the oscillator 104 is suspended by etching the substrate 300, wherein the piezoresistor 102 is covered by the oscillator 104. Then, the piezoresistor 102 is extended out or contracted in of the oscillator to form the first output end 105 and the second output end 106. The first output signal X is outputted from the first output end 105 and the second output signal Y is outputted from the second output end 106. The first output signal X and the second output signal have different phases.

The devices used in the present invention comprises the standard Complementary Metal-Oxide-Semiconductor (CMOS) fabricating techniques and the maskless etching techniques to reduce the packaging cost and to miniaturize the size of the product, thereby achieving a goal of fabricating a resonator having a high-Q and a high signal-to-feedthrough ratio. More importantly, the present invention is the first one to provide a high quality signal processing method using a differential piezoresistive measurement.

Although the present invention has been described in considerable detail with reference to certain embodiments thereof, other embodiments are possible. Therefore, the spirit and scope of the appended claims should not be limited to the description of the embodiments contained herein.

What is claimed is:

1. A micro-electro-mechanical system (MEMS) resonator, comprising:
   a substrate;
   an oscillator located on the substrate;
   a piezoresistor arranged in the oscillator, wherein the piezoresistor comprises:
      a first output end for outputting a first output signal; and
      a second output end for outputting a second output signal, wherein a phase of the second output signal is different from a phase of the first output signal, and a clip-shaped structure is arranged between the first output end of the piezoresistor and the second output end of the piezoresistor; and
   an oscillation initiator arranged on the substrate.

2. The MEMS resonator of claim 1, wherein a phase difference between the first output signal and the second output signal is 150 to 210 degrees.

3. The MEMS resonator of claim 1, wherein a phase difference between the first output signal and the second output signal is 180 degrees.

4. The MEMS resonator of claim 1, wherein the oscillation initiator further comprises first electrode and a second electrode wherein the first electrode is located on the substrate and the second electrode is arranged on the oscillator.

5. The MEMS resonator of claim 4, wherein the second electrode has a gap corresponding to the first electrode.

6. The MEMS resonator of claim 4, wherein the oscillation initiator is a capacitor.

7. The MEMS resonator of claim 4, wherein the piezoresistor and the second electrode are covered by the oscillator.

8. The MEMS resonator of claim 1, wherein the oscillator undergoes a flexural-type oscillation.

9. The MEMS resonator of claim 1, wherein the oscillator undergoes a face-shear oscillation.

10. The MEMS resonator of claim 1, wherein the oscillator undergoes a thickness the mode oscillation.

11. The MEMS resonator of claim 1, wherein the oscillator undergoes a stretching oscillation.

12. The MEMS resonator of claim 1, wherein the piezoresistor is formed from a piezoresistive material.

13. The MEMS resonator of claim 1, wherein the piezoresistor is formed from a poly-silicon material.

14. The MEMS resonator of claim 1, wherein the piezoresistor is formed from a mono-silicon material.

15. The MEMS resonator of claim 1, wherein the piezoresistor is formed from n amorphous silicon material.

16. The MEMS resonator of claim 1, wherein the piezoresistor is formed from a silicon-germanium material.

17. The MEMS resonator of claim 1, wherein the piezoresistor is formed from a silicon-carbide material.

18. The MEMS resonator of claim 1, wherein the oscillator is beam shaped.

19. The MEMS resonator of claim 1, wherein the oscillator has two free ends.

20. A signal processing method using a MEMS resonator which comprises a substrate, an oscillator located on the substrate, an oscillation initiator arranged on the substrate, and a piezoresistor arranged in the oscillator the piezoresistor comprising a first output end for outputting a first output signal and a second output end for outputting a second output signal wherein a phase of the second output signal is different from a phase of the first output signal, and a clip-shaped structure between the first output end of the piezoresistor and the second output end of the piezoresistor, the signal processing method comprising:

performing an oscillation initiation step for initiating oscillation of the oscillator in the MEMS resonator;

performing an output step for outputting the first output signal outputted from the first output end of the piezoresistor, and the second output signal outputted from the second output end of the piezoresistor after the piezoresistor is oscillated by the oscillator;

performing a modulating step for generating a modulating signal by inputting the first output signal and the second output signal which are different in phase into a system integrating operation; and performing a comparing step for comparing a modulating signal with a third signal, wherein the third signal is generated from the oscillation initiator.

21. A method for manufacturing a MEMS resonator which comprises a substrate, an oscillator located on the substrate, an oscillation initiator arranged on the substrate, and a piezoresistor arranged in the oscillator, the piezoresistor comprising a first output end for outputting a first output signal and a second output end for outputting a second output signal, wherein a phase of the second output signal is different from phase of the first output signal, and a clip-shaped structure is arranged between the first output end of the piezoresistor and the second output end of the piezoresistor, the method comprising:

sequentially covering the piezoresistor, the second electrode, and the first electrode in the substrate;

suspending the oscillator by etching the substrate, wherein the piezoresistor and the second electrode are covered by the oscillator;

extending the piezoresistor out of the oscillator to form the first output end and the second output end, wherein the phase of the second output signal outputted from the second output end is different from h phase of the first output signal outputted from the first output end.

* * * * *